US011264204B2

(12) United States Patent
Lin et al.

(10) Patent No.: US 11,264,204 B2
(45) Date of Patent: *Mar. 1, 2022

(54) IMPLANTER CALIBRATION

(71) Applicant: Taiwan Semiconductor Manufacturing Co., Ltd., Hsinchu (TW)

(72) Inventors: Yi-Hsiung Lin, Zhudong Township (TW); Cheng-En Lee, Hsinchu County (TW); Chia-Lin Ou, Hsinchu (TW); Hsuan-Pang Liu, Hsinchu (TW); Yao-Jen Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/080,391

(22) Filed: Oct. 26, 2020

(65) Prior Publication Data

US 2021/0043422 A1 Feb. 11, 2021

Related U.S. Application Data

(63) Continuation of application No. 16/539,513, filed on Aug. 13, 2019, now Pat. No. 10,818,473.

(Continued)

(51) Int. Cl.
*H01J 37/317* (2006.01)
*H01J 37/08* (2006.01)
*H01J 37/30* (2006.01)

(52) U.S. Cl.
CPC .......... *H01J 37/3171* (2013.01); *H01J 37/08* (2013.01); *H01J 37/3002* (2013.01)

(58) Field of Classification Search
CPC ............ H01J 37/3171; H01J 2237/057; H01J 2237/055; H01J 2237/152;
(Continued)

(56) References Cited

U.S. PATENT DOCUMENTS 8,133,804 B1 3/2012 Godet et al.
9,343,263 B2 5/2016 Sasaki et al.
(Continued)

FOREIGN PATENT DOCUMENTS

CN 103155090 A 6/2013
TW 2008/45088 A 11/2008
(Continued)

OTHER PUBLICATIONS

Office Action, dated Aug. 5, 2020, for Taiwan Intellectual Property Office Appl. No. 108128936, 7 pages.
(Continued)

*Primary Examiner* — David A Vanore
(74) *Attorney, Agent, or Firm* — Sterne, Kessler, Goldstein & Fox P.L.L.C.

(57) ABSTRACT

The present disclosure relates to a method includes generating ions with an ion source of an ion implantation apparatus based on an ion implantation recipe. The method includes accelerating the generated ions based on an ion energy setting in the ion implantation recipe and determining an energy spectrum of the accelerated ions. The method also includes analyzing a relationship between the determined energy spectrum and the ion energy setting. The method further includes adjusting at least one parameter of a final energy magnet (FEM) of the ion implantation apparatus based on the analyzed relationship.

20 Claims, 9 Drawing Sheets

Related U.S. Application Data

(60) Provisional application No. 62/718,423, filed on Aug. 14, 2018.

(58) Field of Classification Search
CPC ... H01J 2237/30433; H01J 2237/30472; H01J 2237/31701; H01J 37/1474; H01J 37/3007; H01J 37/08; H01J 37/3002; H01J 37/304; H01J 37/32798
USPC .......................... 250/396 ML, 492.21, 492.3
See application file for complete search history.

(56) References Cited

U.S. PATENT DOCUMENTS

| | | |
|---|---|---|
| 9,466,467 B2 | 10/2016 | Kabasawa et al. |
| 10,283,422 B2 | 5/2019 | Kariya et al. |
| 10,818,473 B2 * | 10/2020 | Lin .................. H01J 37/08 |
| 2005/0205808 A1 | 9/2005 | Li et al. |
| 2006/0145088 A1 | 7/2006 | Ma |
| 2007/0034812 A1 | 2/2007 | Ma et al. |
| 2008/0245957 A1 | 10/2008 | Gupta et al. |
| 2013/0026356 A1 | 1/2013 | Vanderberg et al. |
| 2015/0145404 A1 | 5/2015 | Almasi et al. |
| 2016/0079032 A1 | 3/2016 | Watanabe et al. |
| 2020/0058465 A1 | 2/2020 | Lin et al. |

FOREIGN PATENT DOCUMENTS

| | | |
|---|---|---|
| TW | 2009/43362 A | 10/2009 |
| TW | 2016/11078 A | 3/2016 |
| TW | 2018/20421 A | 6/2018 |
| WO | WO 2008/048598 A2 | 4/2008 |

OTHER PUBLICATIONS

Office Action directed to related Chinese Patent Application No. 201910750030.7, dated Oct. 11, 2021; 10 pages.

* cited by examiner

300

| Recipe | Energy (keV) | AMU | Tune beam | Error gap |
|---|---|---|---|---|
| B+ 10k | 8--12 | 10, 11 | Max beam | ±1% |
| Ar+ 80k | 64--96 | 36, 37, 38, 39, 40, 41, 42 | Max beam | ±1% |
| Xe+++ 70k | 1512--2268 | 129, 131, 132 | Max beam | ±1% |
| Xe+++ 90k | 1944--2916 | 129, 131, 132 | Max beam | ±1% |

FIG. 3

IMPLANTER CALIBRATION

This application is a continuation of U.S. patent application Ser. No. 16/539,513, titled "Implanter Calibration," which was filed on Aug. 13, 2019, which claims the benefit of U.S. Provisional Patent Application No. 62/718,423, titled "System and Method for Calibrating High Energy Implanters," which was filed on Aug. 14, 2018, all of which are incorporated herein by reference in their entireties.

BACKGROUND

High energy implantation is an important process in forming doped layers, either deeply in a substrate or through thick overlying layers and into the substrate. In complementary metal-oxide-semiconductor (CMOS) image sensor technology for very-large-scale integration (VLSI) applications, high energy implantation is a key process to form a deep junction structure between p-type and n-type diffusion profiles that are used as photodiode regions. High energy implantation also offers an advantage of forming n-well or p-well after a high temperature for field oxidation process.

BRIEF DESCRIPTION OF THE DRAWINGS

Aspects of the present disclosure are best understood from the following detailed description when read with the accompanying figures. In accordance with the common practice in the industry, various features are not drawn to scale. In fact, the dimensions of the various features may be arbitrarily increased or reduced for clarity of illustration and discussion.

FIG. 3 illustrates exemplary ion implantation calibration recipes, in accordance with some embodiments.

DETAILED DESCRIPTION

Figure 1:
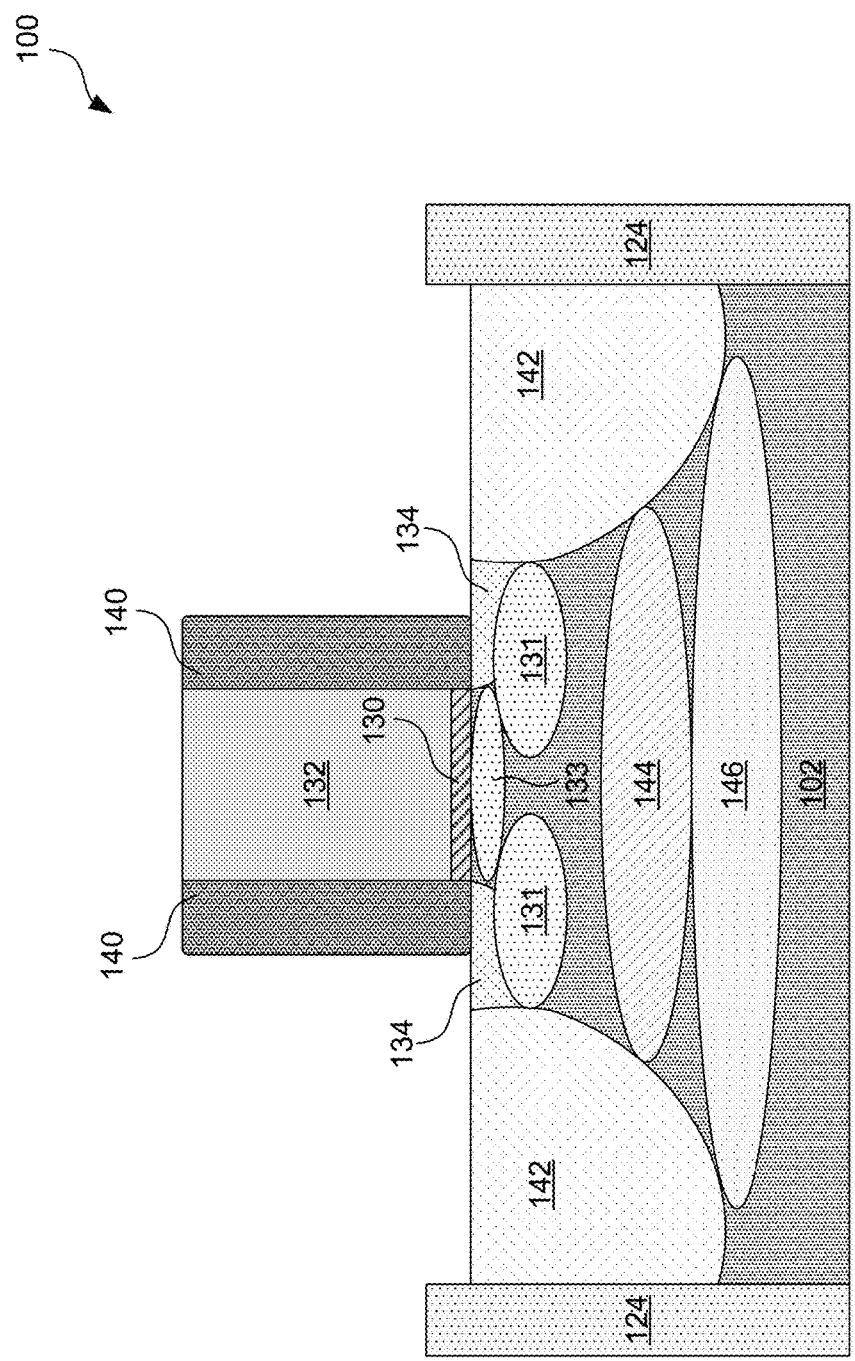
FIG. 1 illustrates a semiconductor device having multiple doped regions formed using a high energy implantation apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in contact (e.g., in direct or physical contact), and may also include embodiments in which additional features are disposed between the first and second features, such that the first and second features are not in contact (e.g., in direct or physical contact). In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

In some embodiments, the terms "about" and "substantially" as used herein indicates the value of a given quantity that can vary based on a particular technology node associated with the subject semiconductor device, such as within ±5% of a target (or intended) value (e.g., ±1%, ±2%, ±3%, ±4%, or ±5% of the value).

The term "deep junction structure" refers to a junction region deeply formed (e.g., between wells or between wells and a substrate) in a semiconductor substrate, such as a deep PN junction formed between an n-type region (e.g., an n-well) and a p-type region (e.g., a p-well or p-type substrate), which can be used in a wide variety of applications including, for example, pinned photodiode, CMOS image sensor, light sensing device, SRAM cell, DRAM cell, RAM or ROM cell, and the like.

Ion implantation is a process in the manufacturing of semiconductor devices that provides a controlled method of changing electrical characteristics of selected regions within a semiconductor device. Ion implantation uses an ion implanter to generate ions of a nominal dopant and then accelerates the ions to an appropriate energy level. Once accelerated, the ions are transported by the ion implanter along an ion beam to impact and implant into selected regions of a semiconductor wafer.

High energy implantation is a technology used to form doped layers, either deep in the substrate or through thick overlying layers into the substrate. As used throughout this disclosure, the term "high energy implantation" refers to an ion implantation process requiring high energy (e.g., between about 200 KV and about 3000 KV) and results in high ion penetration depths. Ion energy control of high energy implantation is becoming increasingly important as device size continues to shrink. Accurate calibration of high energy implanters (HEI) is critical for achieving a nominal doped profile on selected regions of substrates. In addition, accurate calibration for multiple high energy implanters can provide the improved yield in wafer acceptance tests (WATs). In contrast, ion implantation apparatus without calibration can lead to variations and dopant profile mismatches between multiple implanters.

Various embodiments in accordance with this disclosure describe systems and methods for calibrating implanters (e.g., high energy implanters) for use in semiconductor wafer processing, and more particularly to systems and methods for modifying and calibrating final energy magnet (FEM) of an implantation apparatus. The present disclosure provides systems and methods for improving WATs by determining energy gaps between a recipe energy and determined energy of an ion beam at a final energy magnet (FEM), and calibrating the implantation apparatus based on the energy gaps. The calibration system determines target mass and ion beam energy after ions are accelerated and selected by an analysis magnet unit (AMU). The calibration system further determines a total energy amount when ion beams pass through a linear accelerator and through the FEM. The calibration system further determines an error gap between nominal energy specified in a calibration recipe and peak energy of the ion beam energy spectrum determined at the FEM. In some embodiments, the calibration system is configured to adjust at least one parameter of the final energy magnet such that the energy difference or error gap is within about 1% of the energy spectrum specified by the calibration recipe or energy spectrum detected at the AMU. The calibration system can be implemented in one or more implantation apparatuses and maintain good agreement across a group of implanters. For example, a centralized calibration system can be configured to compare secondary ion mass spectrometry (SIMS) measurement data of ion penetration depths from multiple implanters and determine implantation uniformity. In some embodiments, uniformity can be achieved when penetration depth of each implanter obtained from the SIMS measurement data across the group of implanters is within 3% of the average penetration depth among the group of implanters. The centralized calibration system can be further configured to instruct the calibration system of the implanter having abnormal measurements to adjust one or more parameters of the final energy magnet such that its implantation depth is within 3% of the average penetration depths in the group. Although various embodiments disclosed in the present disclosure are directed to high energy implantation apparatus, it should be noted that the various embodiments can also be applied to other implantation apparatus using lower ion energy (e.g., between 1 keV and 30 keV).

FIG. 1 is a cross-sectional view of an exemplary semiconductor device 100 with various doped regions formed using an implantation apparatus, in accordance with some embodiments of the present disclosure. In some embodiments, the implantation apparatus can be a high energy implantation apparatus. Exemplary semiconductor device 100 includes a substrate 102, shallow trench isolation structures 124, gate electrode 132, gate spacers 140, gate dielectric layer 130, lightly-doped regions 134, source/drain regions 142, pocket implantation regions 131, threshold voltage implantation region 133, anti-punch-through implantation region 144, and well implantation region 146. Accurate calibration of the implantation apparatus is critical for achieving the desired doped profile in the above listed semiconductor regions. Without accurate calibration, incorrect dopant profiles would result, which could in turn lead to low device quality and yield. For example, incorrect dopant profile can lead to failure of WATs. Exemplary semiconductor device 100 can further include other suitable structures and are not illustrated in FIG. 1 for simplicity. Components of exemplary semiconductor device 100 are for illustration purposes and are not drawn to scale.

Substrate 102 can be formed using bulk silicon. In some embodiments, substrate 102 can be a p-type substrate, such as a silicon material doped with a p-type dopant (e.g., boron). In some embodiments, substrate 102 can be an n-type substrate, such as a silicon material doped with an n-type dopant (e.g., phosphorous or arsenic). In some embodiments, substrate 102 can include, germanium, diamond, a compound semiconductor, an alloy semiconductor, a silicon-on-insulator (SOI) structure, any other suitable material, or combinations thereof. For example, the compound semiconductor can include silicon carbide, gallium arsenide, gallium phosphide, indium phosphide, indium arsenide, and/or indium antimonide, and the alloy semiconductor can include SiGe, GaAsP, AlInAs, AlGaAs, GaInAs, GaInP, and/or GaInAsP.

Shallow trench isolation structures 124 can be formed in substrate 102 and between semiconductor devices to avoid crosstalk. For example, shallow trench isolation structures 124 are formed in substrate 102 and can be made of a dielectric material, such as silicon oxide, spin-on-glass, silicon nitride, silicon oxynitride, fluorine-doped silicate glass (FSG), a low-k dielectric material, any other suitable insulating material, or combinations thereof. In some embodiments, shallow trench isolation structures 124 can be shallow trench isolation (STI) structures formed by etching trenches in substrate 102. The trenches can be filled with insulating material, followed by an optional chemical-mechanical polishing (CMP) and etch-back process. Other fabrication techniques for shallow trench isolation structures 124 are possible. Shallow trench isolation structures 124 can include a multi-layer structure, such as a structure with one or more liner layers.

Gate dielectric layer 130 can be formed on a top surface of substrate 102, in accordance with some embodiments of the present disclosure. In some embodiments, gate dielectric layer 130 can include a high-k dielectric layer (e.g., dielectric constant greater than 3.9). Gate dielectric layer 130 can be formed through a blanket deposition followed by a patterning and etching process. In some embodiments, gate dielectric layer 130 can be a silicon oxide layer (e.g., silicon dioxide). In some embodiments, gate dielectric layer 130 can include a high-k material, such as hafnium oxide, lanthanum oxide, aluminum oxide, zirconium oxide, silicon nitride, or other suitable high-k materials. Gate dielectric layer 130 can include a plurality of layers and can be formed using a deposition process, such as chemical vapor deposition (CVD), plasma-enhanced CVD (PECVD), atomic layer deposition (ALD), physical vapor deposition (PVD), any other suitable process, or combinations thereof.

Gate electrode 132 is a conductive structure formed on substrate 102, in accordance with some embodiments of the present disclosure. Gate electrode 132 can include conducting materials such as tungsten, titanium, tantalum, copper, titanium nitride, tantalum nitride, molybdenum, other suitable metal or metal alloys, or combinations thereof. In some embodiments, gate electrode 132 can include doped polysilicon material. In some embodiments, gate electrode 132 can also include a diffusion barrier layer, such as titanium nitride (TiN) and titanium silicon nitride (TiSiN). In some embodiments, gate electrode 132 can further include a work-function layer, such as TiN and titanium aluminum (TiAl) for n-type devices and tantalum nitride (TaN) and TiAl for p-type devices. In some embodiments, forming gate electrode 132 can be performed using an ALD process, a CVD process, a PVD process, other suitable deposition processes, or combinations thereof.

Lightly-doped regions 134 are formed in substrate 102, in accordance with some embodiments of the present disclosure. Lightly-doped regions 134 can be referred to as "source and drain extension regions." In some embodiments, lightly-doped regions 134 can be formed using a high energy implantation apparatus calibrated using the devices and methods described in the present disclosure. An implantation is performed to introduce n-type impurities into substrate 102 to form lightly-doped regions 134. N-type impurities include any suitable impurities, such as arsenic, phosphorous, any other suitable impurities, or combinations thereof. Gate electrode 132 can act as mask so that lightly-doped regions 134 can be formed substantially aligned with the edges of gate electrode 132.

Pocket regions 131 can be formed in substrate 102, in accordance with some embodiments of the present disclosure. In some embodiments, pocket regions 131 can be formed using high energy implantation apparatus calibrated using the devices and methods described in the present disclosure. Pocket regions 131 can be formed by tilt implanting p-type impurities, such as boron, indium, any other suitable impurities, or combinations thereof. In some embodiments, impurities can be implanted to a dosage of between about $5\times10^{12}/cm^2$ and about $5\times10^{14}/cm^2$ (e.g., $5\times10^{12}/cm^2$ and $5\times10^{14}/cm^2$). In some embodiments, different dosages can be used.

Source/drain regions 142 are formed in substrate 102, in accordance with some embodiments of the present disclosure. In some embodiments, source/drain regions 142 can be formed using a high energy implantation apparatus calibrated using the devices and methods described in the present disclosure. In some embodiments, source/drain regions 142 are formed by implanting n-type impurities. A photoresist layer can be formed and an implantation is performed to introduce n-type impurities into regions not covered by the photoresist layer. In some embodiments, the implanted impurities include phosphorous or arsenic. In some embodiments, the implanted impurities include both arsenic and phosphorous. In some embodiments, the dosage of arsenic can be lower than the dosage of phosphorous. In some embodiments, the dosage of arsenic is less than about 30 percent of the dosage of phosphorous. The implanted impurity can have a greater concentration closer to the surface of source/drain regions 142, and a lighter concentration deeper in source/drain regions 142. To achieve such a profile, multiple implantations can be performed. In some embodiments, one of the implantations can have a dosage of between about $1\times10^{15}/cm^2$ and about $6\times10^{15}/cm^2$ and implanted with an energy between about 0.5 keV and about 10 keV. In some embodiments, implantation can be performed using a dosage of between about $5\times10^{13}/cm^2$ and about $1\times10^{15}/cm^2$ and implanted with an energy of between about 1 keV and about 30 keV. Each of the implantation process can be may be performed vertically or tilted. For example, a tilt angle can be less than about 15°.

Anti-punch-through implantation region 144 is formed in substrate 102, in accordance with some embodiments of the present disclosure. In some embodiments, anti-punch-through implantation region 144 can be formed using a high energy implantation apparatus calibrated using the devices and methods described in the present disclosure. Anti-punch-through implantation region 144 can be a blanket implantation region below a channel region of semiconductor device 100. Anti-punch-through implantation region 144 can reduce sub-threshold source-to-drain leakage and a drain-induced barrier lowering effect. Anti-punch-through implantation region 144 can be an n-type region or a p-type region. In some embodiments, an n-type anti-punch-through implantation region 144 can be obtained by doping with an n-type dopant, such as arsenic, phosphorous, antimony, any suitable n-type dopant, or combinations thereof. In some embodiments, p-type anti-punch-through implantation region 144 can be obtained by doping with a p-type dopant, such as boron, boron fluorine, any suitable p-type dopant, or combinations thereof. In some embodiments, the ion implantation process can be operated under power in a range from about 3 keV to about 7 keV (e.g., 3 keV to 7 keV) on the substrate surface. In some embodiments, the ion implantation process can be operated within a power range between about 7 keV and about 50 keV (e.g., 7 keV to 50 keV).

Well implantation region 146 is formed in substrate 102, in accordance with some embodiments of the present disclosure. In some embodiments, well implantation region 146 can be formed using a high energy implantation apparatus calibrated using the devices and methods described in the present disclosure. Well implantation region 146 can be formed using a high energy ion implantation process and employing any suitable n-type or p-type dopant. Therefore, the well implantation process may form an n-well or a p-well in semiconductor device 100. In some embodiments, the n-type dopant can include arsenic, phosphorous, any suitable n-type dopant material, or combinations thereof. In some embodiments, the p-type dopant can include boron, aluminum, gallium, indium, any suitable p-type dopant material, or combinations thereof.

In some embodiments, implantation processes can form other suitable regions in semiconductor device 100. For example, high energy implantation processes employing n-type or p-type dopants can form high-voltage doped regions, which may be referred to as "n-channel drift (NHV) regions" or "p-channel drift (PHV) regions"; doped sinker regions; a reduced surface field (RESURF) layer; and/or or other doped extension and/or well regions.

Figure 2:
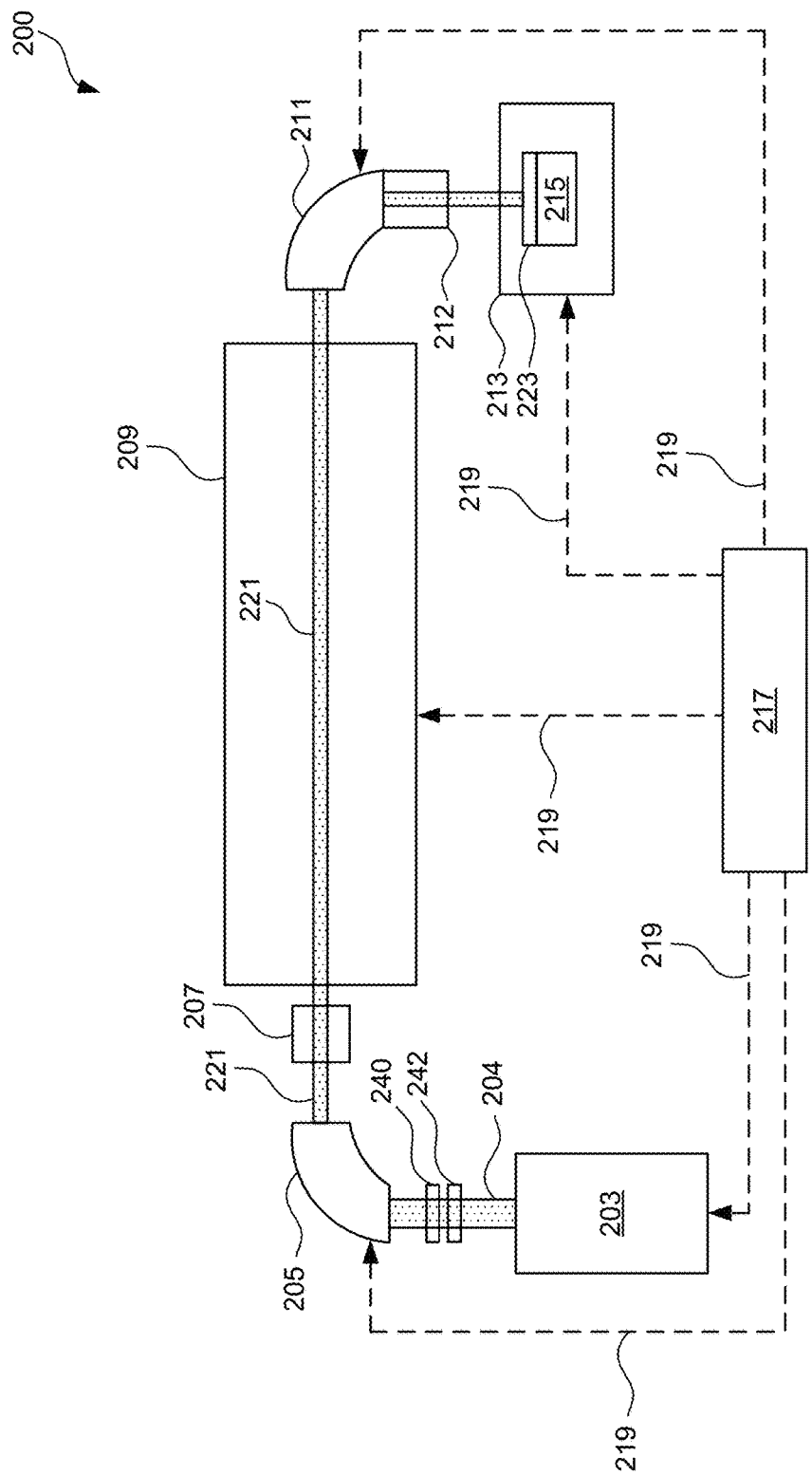
FIG. 2 illustrates an ion implanter, in accordance with some embodiments.

FIG. 2 illustrates an ion implanter 200, in accordance with various embodiments of the present disclosure. In some embodiments, ion implanter 200 can be a high energy ion implantation apparatus. Ion implanter 200 includes an ion source 203, an analysis magnet unit 205, an upstream scanner device 207, a linear accelerator 209, extraction electrode 240, suppression electrode 242, a final energy magnet 211, a scanning device 212, an end station 213, a wafer handling unit 215, and a controller 217 to control the calibration and operation of ion implanter 200.

Ion source 203 can accelerate electrons generated in a plasma discharge to impact neutral gaseous source species, thereby forming source ions which are accelerated along an ion beam line to bombard a target, such as a semiconductor wafer. In some embodiments, ion source 203 generates an ion beam 204 that includes ions having a range of charge-to-mass ratio and ion energy, and only a certain range of ions are suitable for implantation. For example, ion source 203 can be configured to generate boron (B) ions, arsenic (As) ions, argon (Ar) ions, xenon (Xe) ions, and any other suitable ions. In some embodiments, ion source 203 can generate $B^+$ ions, $Ar^+$ ions, and any other suitable ions. In some embodiments, ion source 203 can generate xenon ions with different charges. For example, ion source 203 can generate $Xe^+$, $Xe^{2+}$, or $Xe^{3+}$ ions. In some embodiments, ion source 203 can also include a DC accelerator for accelerating generated ions. Therefore, ion source 203 can generate ions having different ion energy using the DC accelerator and in accordance to ion implantation recipes, for example, $Xe^{3+}$ ions having 70 keV or 90 keV energy can be generated by ion source 203.

Extraction electrode 240 can be used for extracting charged ions from ion beam 204 that combine downstream to form a broad beam. Individual electrodes of suppression electrodes 242 in close proximity to extraction electrode 240 can be biased to inhibit back streaming of neutralizing electrons close to ion source 203 or back to extraction electrode 240.

Analysis magnet unit 205 receives ion beam 204 and separates ions having a desired charge-to-mass ratio for implantation from those ions having an undesired charge-to-mass ratio, according to some embodiments of the present disclosure. Analysis magnet unit 205 includes a pre-analyzing magnet with tunable magnetic field. Ions having identical energies but different masses experience a different magnetic force as they pass through the magnetic field due to their differing masses thereby altering their pathways. As a result, only those desired ions of a particular mass-to-charge ratio pass through a prepositioned orifice in the pre-analyzing magnet. Once a coherent ion beam 221 of suitable charge-to-mass ratio is obtained, coherent ion beam 221 is sent to linear accelerator 209. In some embodiments, an upstream scanner device 207 is located downstream of analysis magnet unit 205. Upstream scanner device 207 is configured to scan coherent ion beam 221 and generate an ion energy spectrum with reference to the beam current of analysis magnet unit 205 and also determine a peak energy of the ion beam. In some embodiments, the ion energy spectrum and peak energy can calibrate ion implanter 200.

Linear accelerator 209 is used to impart additional energy to coherent ion beam 221 as it passes through linear accelerator 209. In some embodiments, linear accelerator 209 is turned off during calibration processes described in the present disclosure. Linear accelerator 209 imparts additional energy using a series of electrodes (not shown) that generate an electromagnetic field which, when the coherent ion beam 221 passes through the electromagnetic field, works to accelerate ions in coherent ion beam 221. Linear accelerator 209 can vary electromagnetic fields periodically with time or adjust the phase of the electromagnetic fields to accommodate ions with different atomic numbers as well as ions having different initial speeds.

Final energy magnet 211 receives coherent ion beam 221 after linear accelerator 209 and the ion energy delivered by ion implanter 200 is determined by one or more parameter settings of final energy magnet 211. Final energy magnet 211 can remove ions or neutral particles that have been generated with an incorrect energy during the acceleration processes. Final energy magnet 211 can be set to provide a particular magnetic field corresponding to a desired ion type by adjusting a final energy magnet current that flows through one or more sets of conductive coils. Accurate calibration (e.g., within 1%, 3%, or any nominal predetermined value) of ion implanters (e.g., high energy ion implanters) is based on the successful calibration of the final energy magnet. The success of final energy magnet calibration process is critical for achieving the desired doped profile on selected regions of substrates. Accurate calibration for multiple high energy implanters can also improve yield in wafer acceptance tests. The calibration system can be implemented on one or more high energy implantation apparatus and maintain good agreement across all implanters.

Scanning device 212 is located downstream of final energy magnet 211. Scanning device 212 is configured to scan the ion beam and generate an ion energy spectrum with reference to the beam control current of final energy magnet 211. For example, scanning device 212 can provide ion energy spectrums with reference to the maximum ion beam control current for final energy magnet. In some embodiments, scanning device 212 can be a probe incorporated in final energy magnet 211. For example, scanning device 212 can be a gauss probe located between poles of final energy magnet 211. In some embodiments, scanning device 212 includes a pair of coils for generating an electromagnetic field that varies in time in accordance with a frequency of the power supplied to the pair of coils. As the ion beam is passed between the pair of coils, the time-varying electromagnetic field deflects ions in the ion beam (e.g., according to the "left-hand rule" or the "right-hand rule"). As a result, the ion beam is reciprocally deflected, i.e., scanned, in the scanning direction between the pair of coils.

End station 213 can house wafer handling unit 215 which handles wafer 223. Wafer 223 will be implanted with ions from coherent ion beam 221. Wafer handling unit 215 is utilized to move wafer 223 in relation to coherent ion beam 221 so as to illuminate different sections of wafer 223 with coherent ion beam 221. For example, wafer handling unit 215 can include two motors (not shown) that are used to control the position of wafer 223 in at least two directions, such as an x-direction and a y-direction, relative to coherent ion beam 221. In some embodiments, other methods and/or structures for moving wafer 223 in relation to coherent ion beam 221 is merely one exemplary method of illuminating different sections of wafer 223 with coherent ion beam 221. Other suitable methods can be used for moving wafers. For example, electrodes can be deflected along the path of coherent ion beam 221 to shift a direction of coherent ion beam 221 in relation to wafer 223 instead of shifting the wafer 223 in relation to coherent ion beam 221. In some embodiments, a multiple wafer rotating system can be used to illuminate multiple wafers in order, or angular implantation methods can also be utilized.

Controller 217 can control the calibration and operating parameters of ion implanter 200. Controller 217 can load, store, and control parameters associated with the calibration and operation of ion implanter 200, such as nominal ion beam current, final energy magnet spectrum, current supplied to the accelerator electrodes, current supplied to the final energy magnet, and/or any other suitable parameters or operations. For example, controller 217 controls ion beam source 203 to vary one or more ion beam properties, such as beam current, beam energy, beam profile, any other suitable ion beam properties, or combinations thereof. Controller 217 further controls parameters, e.g., the scanning frequency, of the scanning operation of scanning device 212. Controller 217 is also coupled to end station 213 to control one or more of workpiece transfer and chuck movement. For example, controller 217 can control, for example, the velocity of the motors of wafer handling unit 215, which, in turn, control the velocity of wafer 223 with respect to coherent ion beam 221. In some embodiments, controller 217 is coupled to scanning device 212 provided within or adjacent to final energy magnet 211 to receive and/or determine ion energy spectrum information for adjusting the final energy magnet or other components of ion implanter 200. In some embodiments, controller 217 is one or more computers or microprocessors programmed to perform one or more functions, such as calibrating or normal operating. Controller 217 can be implemented in either hardware or software, and the parameters can be hardcoded or fed into controller 217 through one or more input ports. Controller 217 can be coupled to components of ion implanter 200 through any suitable means, such as one or more electrical cords 219.

FIG. 3 illustrates a table 300 listing exemplary ion implantation calibration recipes used in an exemplary calibration process for an ion implantation apparatus. As illustrated in FIG. 3, calibration recipes include recipes for various ions, such as boron, argon, and xenon. Recipes for any other suitable ions can be includes, in some embodiments. These exemplary ion implantation calibration recipes can be used to calibrate a single ion implanter, or multiple ion implanters, in a fabrication line to maintain agreement across multiple implanters. Each ion implantation calibration recipe can include suitable parameters for providing ions imparted with nominal ion energy before bombarding semiconductor substrates. In some embodiments, ion implantation calibration recipe can include nominal ion energy for desired for various ions, such as boron, argon, arsenic, xenon, and/or any other suitable ions. In some embodiments, nominal ion energy includes single-charged boron ions ($B^+$) having energy 10 keV, single-charged argon ions ($Ar^+$) having energy 80 keV, triply-charged xenon ions ($Xe^{3+}$) having energy 1890 keV, triply-charged xenon ions ($Xe^{3+}$) having energy 2430 keV, and any other suitable ions and ion energy. For example, nominal ion energy for single-charged boron ions ($B^+$) can have energy between about 8 keV to about 12 keV. In some embodiments, nominal ion energy for single-charged boron ions ($B^+$) can have energy from about 8 keV to about 9 keV, about 9 keV to about 10 keV, about 10 keV to about 11 keV, about 11 keV to about 12 keV. For example, nominal ion energy for single-charged argon ions ($Ar^+$) can have energy from about 64 keV to about 96 keV. In some embodiments, nominal ion energy for single-charged argon ions ($Ar^+$) can have energy from about 64 keV to about 72 keV, about 72 keV to about 80 keV, about 80 keV to about 88 keV, about 88 keV to about 96 keV. For example, nominal ion energy for triply-charged xenon ions ($Xe^{3+}$) can have energy from about 1512 keV to about 2268 keV. In some embodiments, nominal ion energy for triply-charged xenon ions ($Xe^{3+}$) can have energy from about 1512 keV to about 1701 keV, about 1701 keV to about 1890 keV, about 1890 keV to about 2079 keV, about 2079 keV to about 2268 keV. For example, nominal ion energy for triply-charged xenon ions ($Xe^{3+}$) can have energy from about 1944 keV to about 2916 keV. In some embodiments, nominal ion energy for triply-charged xenon ions ($Xe^{3+}$) can have energy from about 1944 keV to about 2187 keV, about 2187 keV to about 2430 keV, about 2430 keV to about 2673 keV, about 2673 keV to about 2916 keV. Ion implantation calibration recipe can also include other suitable information, such as, name of ion implantation recipe, mass of an atom expressed in atomic mass unit, nominal ion beam condition during calibration process, and other suitable information. In some embodiments, the ion implantation recipe also include calibration threshold information, for example, a maximum energy gap between a nominal ion energy required by ion implantation recipe and ion energy detected by final energy magnet. In some embodiments, examples of final energy magnet can be final energy magnet 211 described above in FIG. 2. Detailed calibration process of ion implanter 200 is further described below with reference to FIGS. 4-8.

Figure 4:
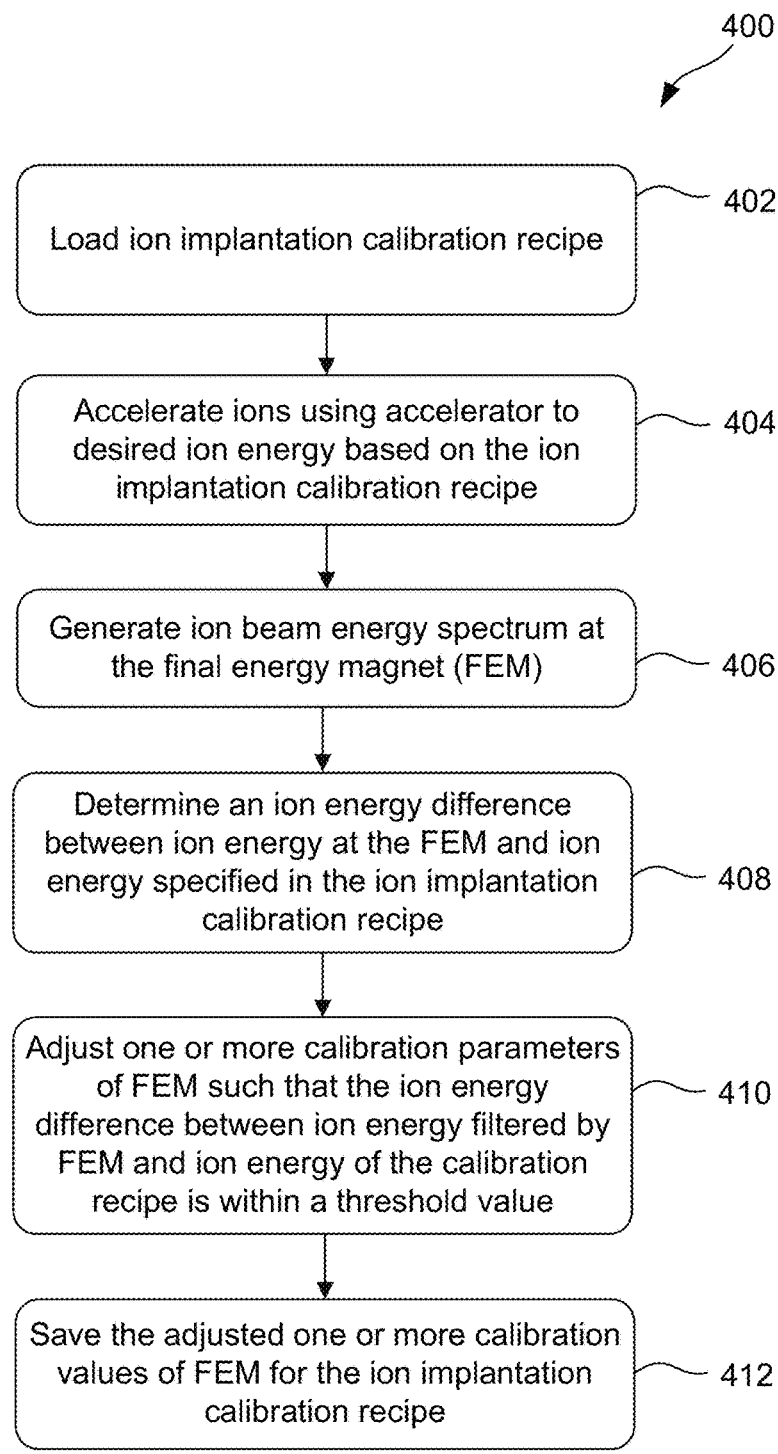
FIG. 4 illustrates a flow diagram of an exemplary method for calibrating one or more ion implanters, in accordance with some embodiments.

FIG. 4 is a flow diagram of an exemplary method 400 for calibrating one or more ion implanters, in accordance with some embodiments of the present disclosure. Other operations in method 400 can be performed and operations of method 400 can be performed in a different order and/or vary. FIGS. 5-8 are provided as exemplary energy spectrum diagrams to facilitate in the explanation of method 400.

At operation 402, an ion implantation calibration recipe is loaded into an ion implanter, in accordance with some embodiments of the present disclosure. Examples of the ion implanter can be ion implanter 200 described above in FIG. 2. Examples of ion implantation the calibration recipe can be ion implantation recipes described above in FIG. 3. In some embodiments, the ion implantation calibration recipe can be loaded into ion implanter 200 by controller 217 to generate and accelerate selected ions to a nominal ion energy.

At operation 404, ion implanter 200 can generate and accelerate ions using an accelerator to a nominal ion energy based on the ion implantation calibration recipe, in accordance with some embodiments of the present disclosure. In some embodiments, ion source 203 of FIG. 2 generates an ion beam that includes ions having a range of charge-to-mass ratio and ion energy suitable for implantation. For example, ion source 203 can generate boron ions, arsenic ions, argon ions, xenon ions, and any other suitable ions based on the ion implantation calibration recipe. In some embodiments, ion source 203 can generate high energy $Xe^{3+}$ ions for calibration purposes. In some embodiments, $Xe^{3+}$ ions are used in the calibration process rather than $Xe^+$ ions which are used in a normal operation process for semiconductor wafers. In a normal operation process, $Xe^+$ ions are generated and accelerated using both accelerator of ion source 203 and linear accelerator 209 to achieve a nominal high ion energy, e.g., 1890 keV or 2430 keV. However, in a calibration process, linear accelerator 209 is configured as a pass through without providing ion acceleration. For example, RF cavities of linear accelerator 209 can be turned off during a calibration process and $Xe^{3+}$ ions can achieve a nominal ion energy in accordance with nominal ion energies by only using the DC accelerator in ion source 203. In some embodiments, single-charged xenon ions can be used for calibration purposes.

At operation 406, an energy spectrum of ion beam passing through the final energy magnet is generated, in accordance with some embodiments of the present disclosure. Final energy magnet 211 of FIG. 2 can remove ions or neutral particles that have been generated with an incorrect energy during the acceleration processes. An ion beam energy spectrum detected at final energy magnet 211 can represent the energy distribution and peak energy of the ion beam allowed to pass through final energy magnet 211. By adjusting the magnetic field strength, final energy magnet 211 removes ions from coherent ion beam 221 that have incorrect energy and allows ions having the correct energy pass through. For example, final energy magnet 211 can adjust its magnetic field by applying different electrical currents to its magnet coils. In some embodiments, ion beam energy spectrum is determined by a scanner device placed within final energy magnet 211. In some embodiments, ion beam energy spectrum is determined by scanner device 212 placed after final energy magnet 211.

At operation 408, an ion energy difference between ion energy obtained at the final energy magnet and ion energy specified in the ion implantation calibration recipe is determined, in accordance with some embodiments of the present disclosure. Controller 217 can be configured to receive ion energy spectrums from corresponding components of ion implanter 200 and determine ion energy differences by comparing ion energy at the final energy magnet and ion energy measured at upstream scanner device 207 placed after the analysis magnet unit. Using recipe "B+10 k" provided in FIG. 3 as an example, the ion energy specified in the calibration recipe can be a starting point for the calibration process. In some embodiments, analysis magnet unit 205 or upstream scanner device 207 can provide an ion energy spectrum based on ion beam 206 and used as starting point for the calibration process.

Figure 5:
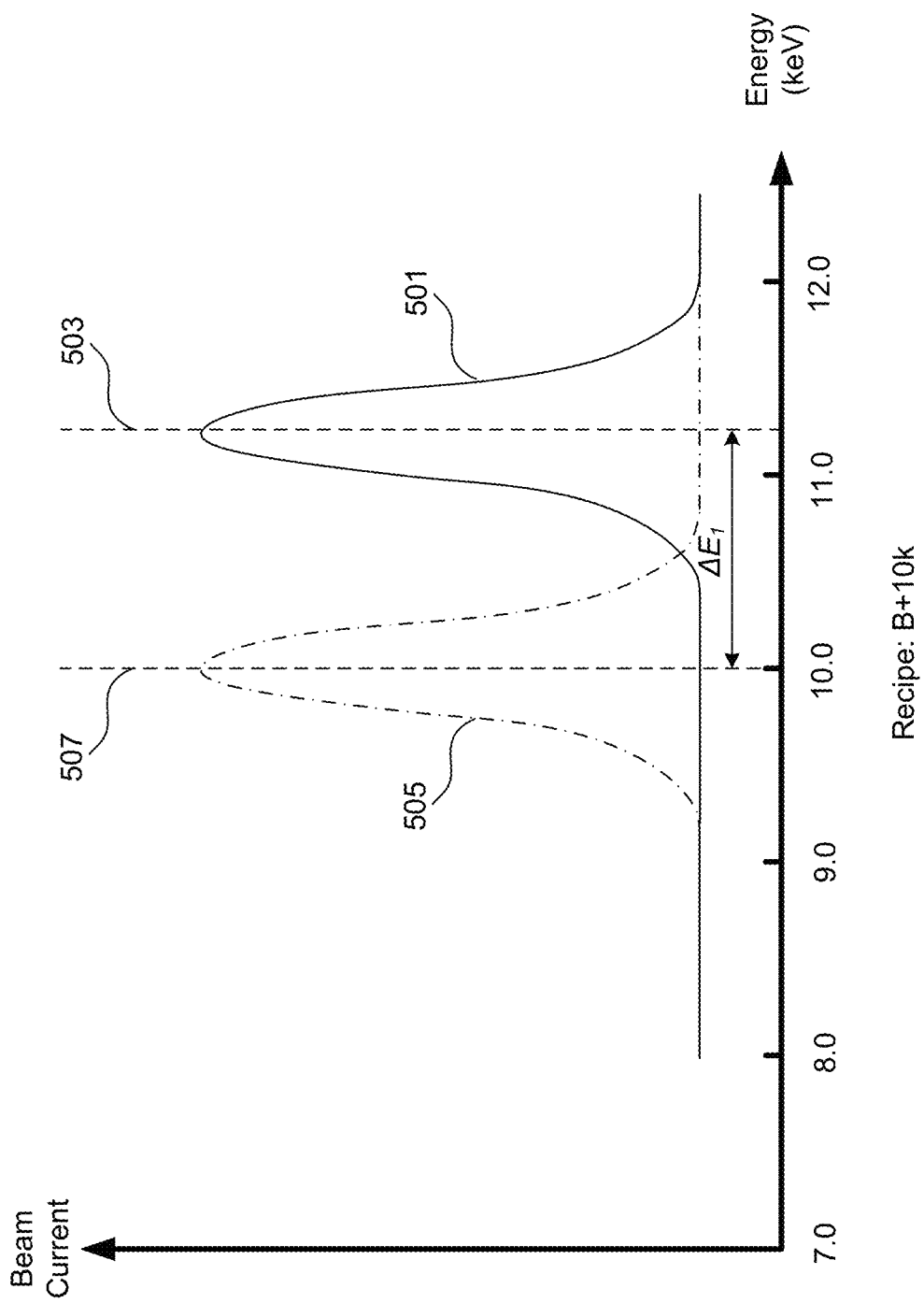
FIGS. 5-8 illustrate ion energy spectrums after calibration for various calibration recipes, in accordance with some embodiments.

The ion energy spectrum determined by scanner device 212 of calibration recipe "B+10 k" is shown as ion energy spectrum 501 illustrated in FIG. 5. Ion energy spectrum 501 illustrates the ion energy distribution and peak ion energy of ion beam processed by final energy magnet 211 and prior to calibration. Controller 217 can be configured to determine peak energy of the ion energy spectrum at final energy magnet 211, determine an ion energy difference between the determined peak energy, compare the peak energy with the ion energy specified by the calibration recipe, and determine whether the energy difference is within a predetermined value. For example, controller 217 can be configured to determine peak energy of ion energy spectrum 501, illustrated by a dashed line 503 intersecting with the x-axis at 11.2 keV. As described above, calibration recipe "B+10 k" specifies a peak energy of 10 keV; therefore, controller 217 can be configured to determine an ion energy difference, or error gap, $\Delta E_1$ to be the difference between peak energy of ion energy spectrum and energy specified by the calibration recipe divided by the energy specified by the calibration recipe (or ion energy determined by upstream scanner device 207). In this scenario, $\Delta E_1$=(11.2 keV−10 keV)/10 keV=1.2%. The predetermined value can be a maximum energy difference permitted between the ion energy of ion beam at final energy magnet 211 and an ion energy specified by the calibration recipe. For example, the predetermined value can be about 1%, which is of the ion energy difference divided by the energy specified in the calibration energy or ion energy detected of ion beam 221 detected by upstream scanner device 207. In some embodiments, the predetermined value can be 0.5%, 3%, 5%, or any other suitable value determined by the need of the ion implantation process. Since the predetermined value represents the allowed energy difference between an detected ion energy and a nominal ion energy, a lower predetermined value provides a more precise calibration process. In some embodiments, calibration recipes can specify any suitable peak energies or range of peak energies, and the predetermined value can be a maximum energy difference permitted between the ion energy of ion beam and the range of ion energy specified by the calibration recipe. For example, calibration recipe "B+10 k" can also specify peak energy between about 9 keV and about 11 keV. In some embodiments, calibration recipe can specify peak energy between about 9 keV and about 10 keV, between about 10 keV to about 11 keV.

At operation 410, one or more calibration parameters of the final energy magnet is adjusted such that the ion energy difference between ion energy detected at final energy magnet and ion energy specified in the calibration recipe is within the predetermined value, in accordance with some embodiments of the present disclosure. Using calibration recipe "B+10 k" described above in operation 408 as an example, the ion energy difference $\Delta E_1$ can be 1.2%, which is greater than the predetermined value of about 1%. By adjusting one or more calibration parameters of final energy magnet 211, the ion energy difference $\Delta E_1$ can be reduced to less than the predetermined value. For example, based on the determined ion energy difference $\Delta E_1$, the controller 217 can be configured to adjust the electrical current (e.g., beam control current) that controls the magnetic field of final energy magnet. Controller 217 can be further configured to determine the ion energy difference $\Delta E_1$ after the adjustment and maintain the electrical current in response to ion energy difference $\Delta E_1$ being within the predetermined value. In some embodiments, any other suitable calibration parameters can be adjusted. In some embodiments, controller 217 can adjust any suitable parameters such that the ion energy difference $\Delta E_1$ can successfully be within the predetermined value. As shown in FIG. 5, ion energy spectrum 505 illustrates ion energy spectrum of the ion beam after controller 217 adjusts one or more calibration parameters such that the ion energy difference is within the predetermined value, such as about 1%. Ion energy spectrum 505 of the ion beam provided by calibrated final energy magnet 211 illustrates a peak energy of ion energy spectrum 505, illustrated by a dashed line 507 intersecting with the x-axis at 10 keV. In some embodiments, the suitable parameters can be beam control current of the FEM. In some embodiments, the predetermined value can be any suitable value determined by implantation need. For example, the predetermined value can be about 0.5%, about 1.5%, about 2%, or any other suitable value.

At operation 412, the adjusted one or more calibration values of the final energy magnet for a calibration recipe is saved, in accordance with some embodiments of the present disclosure. Controller 217 can be configured to store the adjusted one or more calibration values of the final energy magnet in a storage device and control the final energy magnet during normal operation using the stored adjusted one or more calibration values. Controller 217 can include a computer system that includes a microprocessor, an input device, a storage device, a system memory, a display, and a communication device all interconnected by one or more buses. In some embodiments, controller 217 can be configured to receive user input directly from the input device. The storage device can be a hard drive, an optical device, and/or any other suitable storage device. The storage device can be capable of receiving CD-ROM, DVD-ROM, USB storage device, or any suitable forms of computer-readable medium that may include computer-executable instructions. After calibration of one calibration recipe is completed, another recipe can be loaded into ion implanter 200 and the final energy magnet can be calibrated in a fashion similar to operations 402 through 412.

Figure 6:
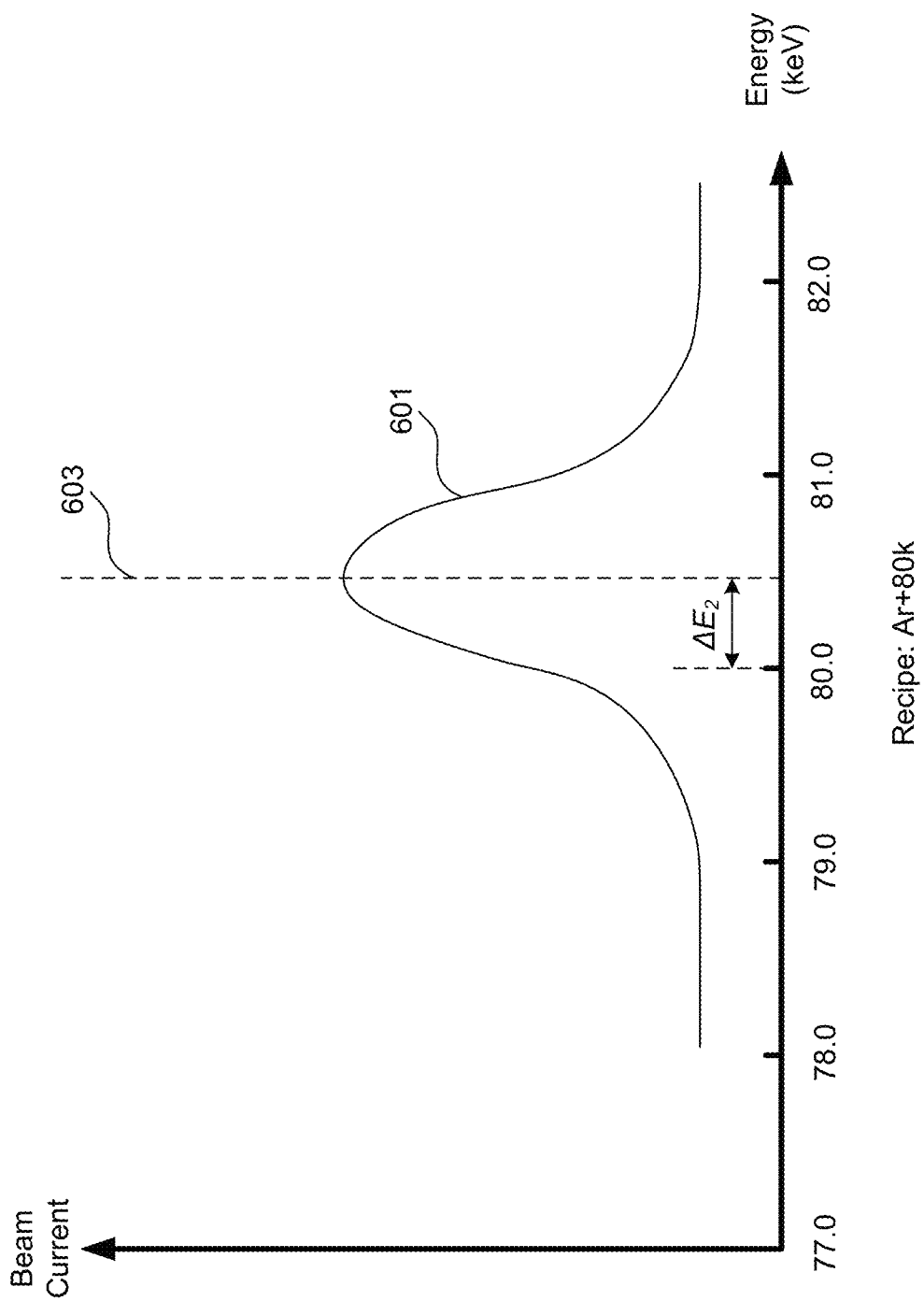
Figure 7:
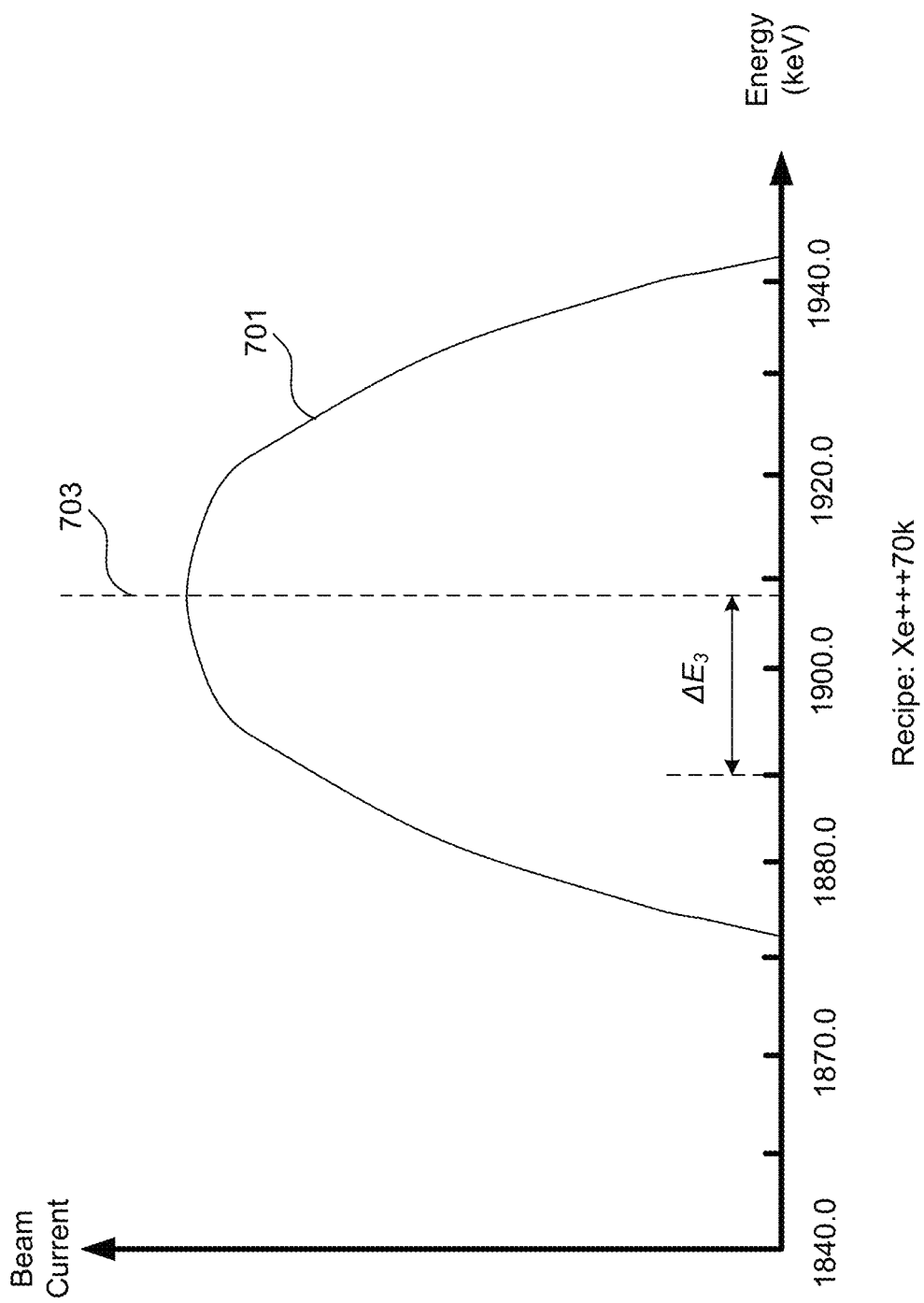
Figure 8:
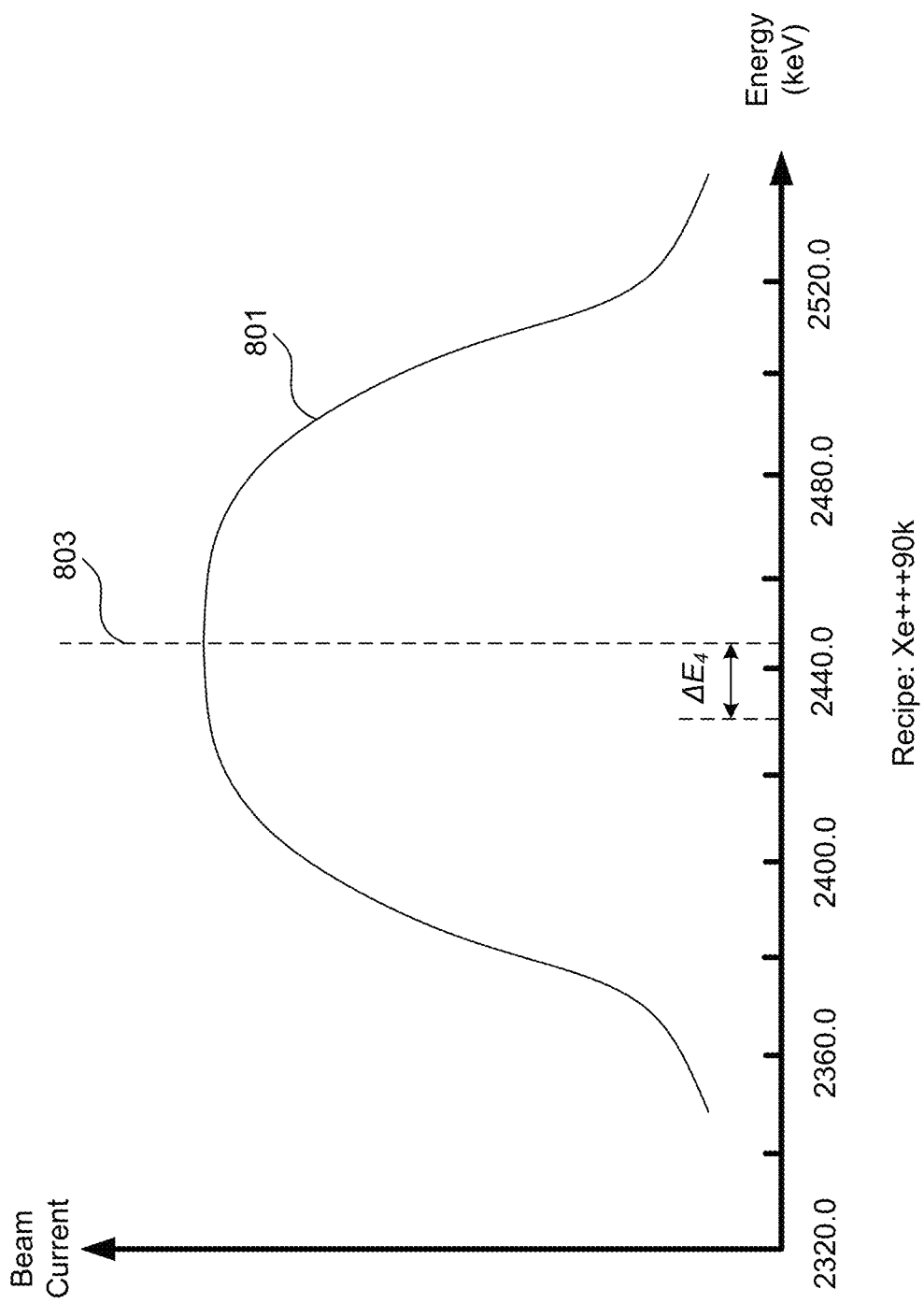

FIGS. 6-8 illustrate ion energy spectrums after calibration for various calibration recipes, in accordance with some embodiments of the present disclosure. FIGS. 6-8 illustrate ion energy spectrum diagrams determined by scanner device 212 after calibration of calibration recipe "Ar+80 k," "Xe+++70 k," and "Xe+++90 k" of list of recipes shown in FIG. 3, respectively. In FIG. 6, the ion energy spectrum determined by scanner device 212 of calibration recipe "Ar+80 k" is shown as ion energy spectrum 601 illustrated in FIG. 6. Ion energy spectrum 601 illustrates the ion energy distribution and peak ion energy of ion beam processed by final energy magnet 211 and after calibration. Ion energy spectrum 601 of the ion beam provided by calibrated final energy magnet 211 illustrates a peak energy of ion energy spectrum, illustrated by a dashed line 603 intersecting with the x-axis at 80.4 keV. During the calibration process, controller 217 can be configured to determine peak energy of the ion energy spectrum at final energy magnet 211, determine an ion energy difference between the determined peak energy, compare the peak energy with the ion energy specified by the calibration recipe, and determine whether the energy difference is within a predetermined value. After the calibration process, controller 217 can be configured to determine whether an ion energy difference, or error gap, $\Delta E_2$ is within a predetermined value, such as about 1% of the ion energy specified in the calibration recipe or ion energy detected at upstream scanner device 207. In this scenario, $\Delta E_2$=(80.4 keV−80 keV)/80 keV=0.5%, therefore the energy difference or error gap satisfies the predetermined value and controller 217 can store the calibrated system parameters and move on to load the next calibration recipe if needed.

In FIG. 7, the ion energy spectrum determined by scanner device 212 of calibration recipe "Xe+++70 k" is shown as ion energy spectrum 701 which illustrates the ion energy distribution and peak ion energy of ion beam processed by final energy magnet 211 and after calibration. Ion energy spectrum 701 of the ion beam provided by calibrated final energy magnet 211 illustrates a peak energy of ion energy spectrum, illustrated by a dashed line 703 intersecting with the x-axis at 1909 keV. After the calibration process, controller 217 can be configured to determine whether an ion energy difference, or error gap, $\Delta E_3$ is within a predetermined value, such as about 1% of the ion energy specified in the calibration recipe or ion energy detected at upstream scanner device 207. In this scenario, $\Delta E_3 = (1909\text{ keV} - 1890\text{ keV})/1890\text{ keV} = 1.0\%$, therefore the energy difference or error gap satisfies the predetermined value and controller 217 can store the calibrated system parameters and move on to load the next calibration recipe if needed.

In FIG. 8, the ion energy spectrum determined by scanner device 212 of calibration recipe "Xe+++90 k" is shown as ion energy spectrum 801 which illustrates the ion energy distribution and peak ion energy of ion beam processed by final energy magnet 211 and after calibration. Ion energy spectrum 801 of the ion beam provided by calibrated final energy magnet 211 illustrates a peak energy of ion energy spectrum, illustrated by a dashed line 803 intersecting with the x-axis at 2445 keV. After the calibration process, controller 217 can be configured to determine whether an ion energy difference, or error gap, $\Delta E_4$ is within a predetermined value, such as about 1% of the ion energy specified in the calibration recipe or ion energy detected at upstream scanner device 207. In this scenario, $\Delta E_4 = (2445\text{ keV} - 2430\text{ keV})/2430\text{ keV} = 0.6\%$, therefore the energy difference or error gap satisfies the predetermined value and controller 217 can store the calibrated system parameters and move on to load the next calibration recipe if needed.

Figure 9:
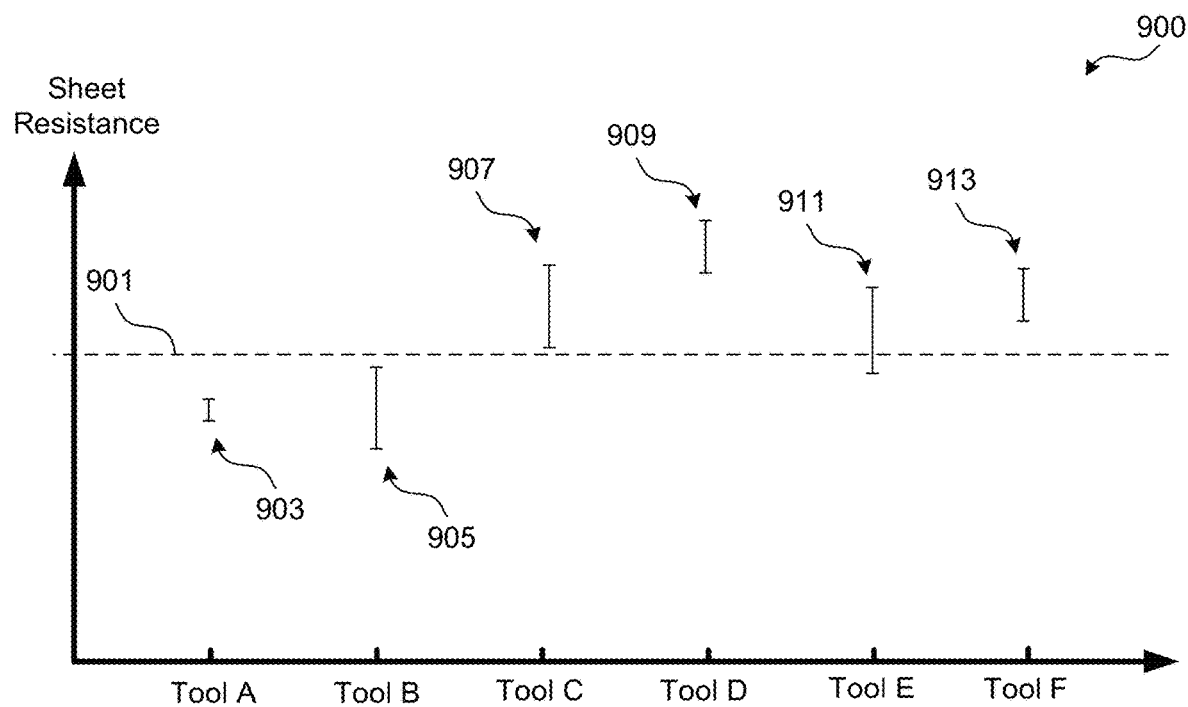
FIGS. 9-10 illustrate exemplary results of wafer acceptance tests showing improved agreements between multiple ion implanters after calibration processes, in accordance with some embodiments.
Figure 10:
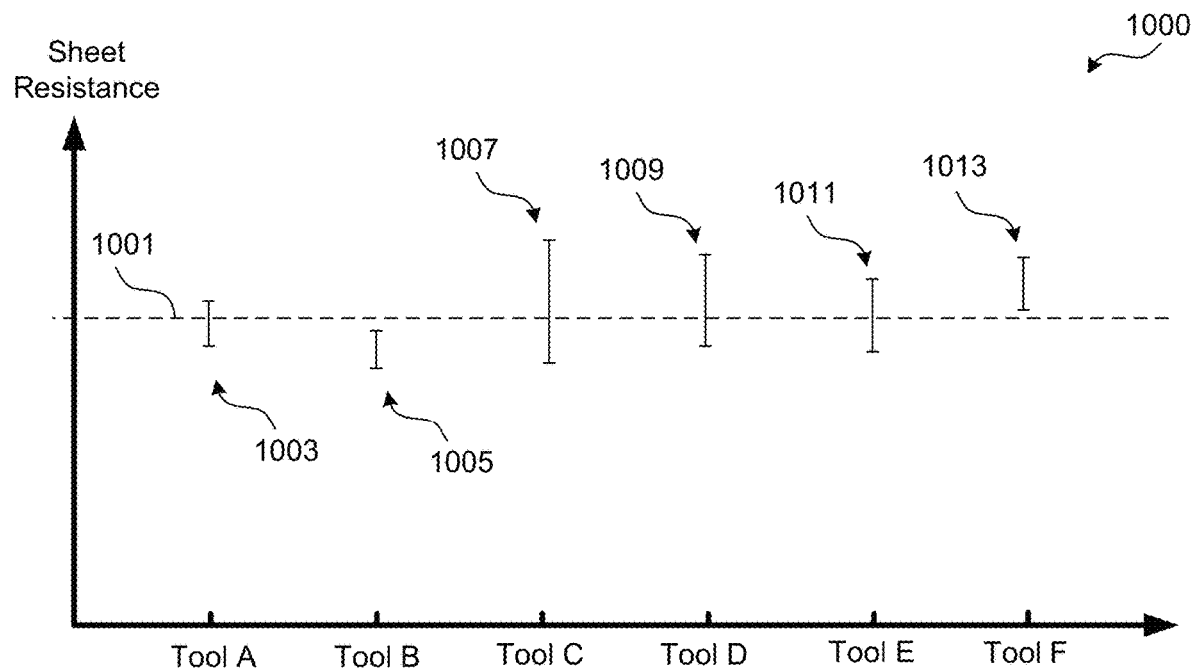

FIGS. 9-10 illustrate exemplary results of wafer acceptance tests showing improved agreements between multiple ion implanters after the calibration processes, in accordance with some embodiments of the present disclosure. FIG. 9 illustrates sheet resistance of a plurality of wafers processed by ion implanters Tools A-F prior to the calibration process described above with reference to operations 402 through 412. As shown in FIG. 9, reference resistance value 901 is used as a reference point and sheet resistance values 903-913 represent measured sheet resistances on Tools A-F, respectively. Prior to ion implanter calibration, the sheet resistance values 903-913 are determined to be within 2 sigma (i.e., two standard deviations) of reference resistance value 901, which can cause long term resistance reference shift and mismatching between a line of ion implanter tools. However, using the calibration process described above in operations 402-412, mismatch can be reduced and improved agreement is maintained between ion implanters. FIG. 10 includes wafer sheet resistance values of wafer processed by calibrated Tools A-F. For example, FIG. 10 includes reference resistance value 1001 and sheet resistance values 1003-1013 representing measured sheet resistances on Tools A-F, respectively. After ion implanter calibration, the sheet resistance values 1003-1013 are determined to be within 1 sigma (i.e., one standard deviation) of reference resistance value 1001, which indicates improved precision and agreement between ion implanters.

Various embodiments in accordance with this disclosure describe systems and methods for calibrating high energy implanters for use in semiconductor wafer processing, and more particularly to systems and methods for modifying and calibrating a final energy magnet of a high energy implantation apparatus. The present disclosure provides systems and methods for improving wafer acceptance tests by determining energy gaps between the recipe energy and determined energy of the ion beam and calibrating the high energy implantation apparatus accordingly based on the determined energy gap. The calibration system determines target mass and ion beam energy after ions are accelerated and selected by the analysis magnet unit. The calibration system further determines a total energy amount when an ion beam passes through a linear accelerator and through a final energy magnet. The calibration system further determines the error gap between recipe energy and determined energy using the ion beam spectrum at the final energy magnet. In some embodiments, the energy difference or error gap is within about 1% of the energy spectrum. The calibration system can be implemented in one or more high energy implantation apparatus to maintain good agreement across all implanters.

In some embodiments a method includes generating ions with an ion source of an ion implantation apparatus based on an ion implantation recipe. The method includes accelerating the generated ions based on an ion energy setting in the ion implantation recipe and determining an energy spectrum of the accelerated ions. The method also includes analyzing a relationship between the determined energy spectrum and the ion energy setting. The method further includes adjusting at least one parameter of a final energy magnet (FEM) of the ion implantation apparatus based on the analyzed relationship.

In some embodiments a method for calibrating an ion implantation apparatus includes loading an ion implantation recipe in the ion implantation apparatus and generating ions by an ion source based on the ion implantation recipe. The method includes accelerating the ions based on an ion energy setting in the ion implantation recipe and determining an energy spectrum of the accelerated ions at a final energy magnet (FEM) of the ion implantation apparatus. The method also includes determining a peak energy of the energy spectrum and determining a difference between the peak energy and the ion energy setting. The method further includes adjusting at least one parameter of the FEM based on the difference being greater than a predetermined value.

In some embodiments, an ion implantation apparatus includes an ion source configured to accelerate ions based on an ion implantation recipe and a final energy magnet (FEM) configured to determine an energy spectrum of the accelerated ions and to determine a peak energy of the energy spectrum. The apparatus further includes a controller configured to determine a difference between the peak energy and an ion energy setting in the ion implantation recipe and to adjust at least one parameter of the FEM based on the difference being greater than a predetermined value.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
    determining an energy spectrum of accelerated ions produced by an ion implantation apparatus;
    analyzing a relationship between the determined energy spectrum and an ion energy setting of the ion implantation apparatus; and
    adjusting at least one parameter of a final energy magnet (FEM) of the ion implantation apparatus based on the analyzed relationship.

2. The method of claim 1, wherein the at least one parameter comprises a beam control current of the FEM.

3. The method of claim 1, further comprising determining a peak energy of the determined energy spectrum.

4. The method of claim 3, wherein the relationship comprises a difference between the peak energy and the ion energy setting.

5. The method of claim 4, wherein the adjusting the at least one parameter comprises adjusting the at least one parameter such that the difference between the peak energy and the ion energy setting is less than a predetermined value.

6. The method of claim 5, wherein the predetermined value comprises an energy difference of about 1% of the ion energy setting.

7. The method of claim 5, wherein the predetermined value comprises an energy difference of about 3% of the ion energy setting.

8. The method of claim 5, wherein the predetermined value comprises an energy difference of about 5% of the ion energy setting.

9. The method of claim 1, wherein the generated ions comprise xenon ions.

10. The method of claim 1, further comprising determining a peak energy of the energy spectrum, and wherein analyzing the relationship comprises determining a difference between the peak energy and the ion energy setting.

11. A method, comprising:
    determining an energy spectrum of accelerated ions at a final energy magnet (FEM) of an ion implantation apparatus;
    determining a first peak energy of the energy spectrum;
    determining a first difference between the first peak energy and an ion energy setting of the ion implantation apparatus; and
    adjusting at least one parameter of the FEM in response to the first difference being greater than a predetermined value.

12. The method of claim 11, wherein adjusting the at least one parameter comprises adjusting a beam control current of the FEM.

13. The method of claim 11, further comprising;
    determining a second peak energy of the energy spectrum and a second difference between the second peak energy and the ion energy setting; and
    maintaining the at least one parameter of the FEM in response to the second difference being less than the predetermined value.

14. The method of claim 13, further comprising loading an ion implantation recipe in the ion implantation apparatus in response to the second difference being less than the predetermined value.

15. The method of claim 11, wherein the adjusting the at least one parameter comprises adjusting the first difference between the first peak energy and the ion energy setting to be less than the predetermined value.

16. An apparatus, comprising:
    a final energy magnet (FEM) configured to determine a peak energy of an ion energy spectrum; and
    a controller configured to determine a difference between the peak energy and a preset ion energy setting and to adjust at least one parameter of the FEM based on the difference being greater than a predetermined value.

17. The apparatus of claim 16, wherein the at least one parameter comprises a beam control current of the FEM.

18. The apparatus of claim 16, wherein the controller is further configured to load an ion implantation recipe in the apparatus in response to the difference being less than the predetermined value.

19. The apparatus of claim 16, wherein the controller is further configured to adjust the at least one parameter such that the difference between the peak energy and the ion energy setting is less than the predetermined value.

20. The apparatus of claim 16, wherein the predetermined value comprises an energy difference of about 1% of the ion energy setting.

* * * * *